(12) United States Patent
Teunissen et al.

(10) Patent No.: US 9,957,602 B2
(45) Date of Patent: May 1, 2018

(54) METHOD FOR PRODUCING THERMOELECTRIC LAYERS

(75) Inventors: Ralph Teunissen, Deventer (NL); Gerhard Span, Wattens (AT)

(73) Assignee: MAHLE INTERNATIONAL GMBH, Stuttgart (DE)

( * ) Notice: Subject to any disclaimer, the term of this patent is extended or adjusted under 35 U.S.C. 154(b) by 641 days.

(21) Appl. No.: 13/381,468

(22) PCT Filed: Jun. 10, 2010

(86) PCT No.: PCT/EP2010/058142
§ 371 (c)(1),
(2), (4) Date: Dec. 29, 2011

(87) PCT Pub. No.: WO2011/000676
PCT Pub. Date: Jan. 6, 2011

(65) Prior Publication Data
US 2012/0152729 A1    Jun. 21, 2012

(30) Foreign Application Priority Data
Jun. 30, 2009   (DE) .................. 10 2009 031 302

(51) Int. Cl.
*C23C 14/34* (2006.01)
*H01J 37/34* (2006.01)
(Continued)

(52) U.S. Cl.
CPC ...... *C23C 14/3414* (2013.01); *C23C 14/0623* (2013.01); *C23C 14/0682* (2013.01);
(Continued)

(58) Field of Classification Search
USPC ............ 204/298.12, 192.15, 192.22, 192.25, 204/192.26
See application file for complete search history.

(56) References Cited

U.S. PATENT DOCUMENTS 5,057,161 A * 10/1991 Komabayashi et al. ...... 136/240
5,415,829 A    5/1995 Ohhashi et al.
(Continued)

FOREIGN PATENT DOCUMENTS

CN    1233347 A    10/1999
CN    2901304 Y    5/2007
(Continued)

OTHER PUBLICATIONS

Xuecheng Kuang, et al. "Research Progress and Development Tendency of Thermoelectric Materials" Foshan Ceramics, pp. 34-40, vol. 18, No. 6.

(Continued)

*Primary Examiner* — Jason Berman
(74) *Attorney, Agent, or Firm* — Lucas & Mercanti, LLP

(57) ABSTRACT

The invention relates to a method for producing thermoelectric layers by depositing thermoelectric material on a substrate by means of sputter deposition. In order to create a method for producing thermoelectric layers that are better suited for use in thermogenerators, and in particular have higher Seebeck coefficients, the production of a target made of thermoelectric material is proposed by mixing at least two powdered starting materials having a particle size from 0.01 µm-5000 µm, while coupling in energy and depositing the thermoelectric material from the target on the substrate by way of magnetron sputter deposition.

13 Claims, 3 Drawing Sheets

(51) Int. Cl.
C23C 14/06 (2006.01)
H01L 35/16 (2006.01)
H01L 35/22 (2006.01)
H01L 35/34 (2006.01)

(52) U.S. Cl.
CPC .......... *H01J 37/3426* (2013.01); *H01L 35/16* (2013.01); *H01L 35/22* (2013.01); *H01L 35/34* (2013.01)

(56) References Cited

U.S. PATENT DOCUMENTS

| | | | |
|---|---|---|---|
| 6,176,986 B1* | 1/2001 | Watanabe et al. | 204/298.13 |
| 7,851,691 B2* | 12/2010 | DeSteese et al. | 136/201 |
| 2002/0130041 A1* | 9/2002 | Wen et al. | 204/298.12 |
| 2003/0175142 A1 | 9/2003 | Milonopoulou et al. | |
| 2006/0063291 A1 | 3/2006 | Shin et al. | |
| 2006/0065298 A1* | 3/2006 | Nakashima et al. | 136/256 |
| 2008/0271779 A1* | 11/2008 | Miller et al. | 136/252 |
| 2009/0130365 A1* | 5/2009 | Kojima et al. | 428/64.4 |
| 2010/0206724 A1* | 8/2010 | Takahashi | 204/298.13 |

FOREIGN PATENT DOCUMENTS

| | | |
|---|---|---|
| EP | 1 293 769 | 3/2003 |
| EP | 1 737 053 | 12/2006 |
| GB | 1 468 948 | 3/1977 |
| WO | WO 2009/112388 | 9/2009 |

OTHER PUBLICATIONS

English translation of the International Preliminary Report on Patentability (Chapter II) issued in the corresponding International Application No. PCT/EP2010/058142.

Kobayashi, K. et al., "Fabrication of Bi-Te Thermoelectric Device by Radio Frequency Sputtering Target Prepared by MA-PCS Process" Database Accession No. E2003037326700; & Funtai Oyobi Fummatsu Yakin/Journal of Japan Society of Powder and Powder Metallurgy Oct. 2002 Funtai Funamtsu Yakin Kyokai/Japan Society of Powder Metallurgy JP. vol. 49, No. 10, Oct. 2002. (Oct. 2002), pp. 928-932. (Abstract).

Kusakabe, R. et al., "Fabrication of (Bi2te3) o.25 (Sb2Te3) o.75 Thermoelectric Film by Radio Frequency Sputtering Target Prepared by MA-PCS Process" Database Accession No. E2002337050178; & Funtai Oyobi Fummatsu Yakin/Journal of the Japan Society of Powder and Powder Metallurgy May 2002 Funtai Funamtsu Yakin Kyokai/Japan Society of Powder Metallurgy JP. vol. 49, No. 5, May 2002 (May 2002), pp. 412-416. (Abstract).

Matsumoto, A. et al., "Preparation of Fe2VAl Thermoelectric Module by RF Sputtering" Database Accession No. 9434950; & Materials Science Forum Trans Tech Publications Switzerland. vol. 539-543, pp. 3285-3289. (Abstract).

International Search Report corresponding to PCT/EP2010/058142.
International Preliminary Examination Report corresponding to PCT/EP2010/058142.
Written Opinion corresponding to PCT/EP2010/058142.
German Office Action dated Jan. 20, 2010 corresponding to DE 10 2009 031 302.8-45.

F. Kurdesau, et al. "Comparative study of ITO layers deposited by DC and RF magnetron sputtering at room temperature" Journal of Non-Crystalline Solids, 2006.

E. Alfonso, et al. "Thin Film Growth Through Sputtering Technique and Its Applications" Crystallization—Science and Technology, Chap. 15, Sep. 2012.

M F Cerqueira, et al. "Micorcrystalline silicon thin films prepared by RF reactive magnetron sputter deposition" Vacuum vol. 46 No. 12, p. 1385, 1995.

* cited by examiner ized to a sputter target by hot pressing at a temperature in a range of 200-700°C. and pressures of 50-5,000 bar, the temperatures and pressures depend-# METHOD FOR PRODUCING THERMOELECTRIC LAYERS

CROSS-REFERENCE TO RELATED APPLICATIONS

This is a U.S. national stage of application No. PCT/EP2010/058142 filed 10 Jun. 2010. Priority is claimed on German Application No. 10 2009 031 302.8 filed 30 Jun. 2009, the content of which is incorporated herein by reference in its entirety.

BACKGROUND OF THE INVENTION

Field of the Invention

The invention pertains to a method for producing thermoelectric layers by deposition of thermoelectric material onto a substrate by sputter deposition.

Thermoelectric layers with different thermoelectric materials are required so that use can be made of thermoelectricity. The thermoelectric effect, also called the Seebeck effect, describes the reversible interaction between temperature and electricity. The Seebeck voltage is determined by:

$$U_{Seebeck} = \alpha \times \delta T$$

where $\delta T$ is the temperature difference between the hot side and the cold side, and $\alpha$ is the Seebeck coefficient or thermoelectric force.

The Seebeck coefficient has the dimension of an electric voltage per temperature difference (V/K). The size of the Seebeck coefficient is the most important of the factors which determine the value of the Seebeck voltage.

Thermoelectric elements with different metals connected to each other at one end convert thermal energy into electrical energy very inefficiently. Other thermoelectric materials, especially semiconductor materials such as $Bi_2Te_3$, $Bi_2Se_3$, $Sb_2Te_3$, PbTe, SiGe, $FeSi_2$, and their alloys are therefore used for thermoelectric generators.

The thermoelectric generators available today nevertheless have only a relatively low degree of efficiency; it is only a fraction (approximately 17%) of the Carnot efficiency.

In addition to the conventional thermoelectric materials in the form of blocks arranged between plates, DE 101 22 679 A1 has already disclosed thermoelectric materials in the form of thin layers for the production of thermoelectric generators.

According to the prior art, thermoelectric layers are produced by reactive sputtering, in which the chemical elements of the targets react with each other to form a chemical compound. There are no chemical reactions between a reactive gas and the chemical elements of the targets. During reactive sputtering, the elements bismuth, tellurium, selenium, and antimony are broken out of separate targets and deposited onto a substrate in the reaction chamber. A direct-current gas discharge in the reaction chamber is usually used as the ion source, which serves to deposit the corresponding compounds of the individual elements bismuth, tellurium, selenium, and antimony onto the substrate.

During this reactive sputtering, the chemical compounds are formed by exothermic reactions both in the sputtering chamber and also on the substrate. As a result of this additional heat input, the layers are subjected to an in-situ heat treatment (tempering), which leads to a decrease in the number of grain boundaries which form in the thermoelectric layers. The Seebeck coefficient of the deposited layers of thermoelectric material which can be achieved by this type of reactive sputtering and thus the efficiency of a thermoelectric generator produced in this way are therefore suboptimal.

The solid targets made up of the chemical elements bismuth, tellurium, selenium, and antimony are produced by means of hot pressing, as known in and of itself for the production of these types of sputter targets. WO 2007/042255 A1 discloses this type of hot pressing process for the production of a sputter target, although this target is not intended for the production of thermoelectric layers.

EP 1 737 053 A1 discloses a method for producing thermoelectric layers by the sputtering of a target produced by mixing several components together. Conventional sputtering, which belongs to the group of PVD processes, tries to achieve a high degree of crystallization to obtain good thermoelectric properties in the deposited thin layer, the goal being to produce a thin layer consisting of a single crystal. The high degree of crystallization in the thermoelectric layer results in an increase in conductivity. The degree of crystallization, however, is strongly dependent on the thickness of the layer. As the thickness of the layer increases, the degree of crystallization decreases. The maximum layer thickness for the best degree of crystallization is therefore very small; according to the teaching of EP 1 737 053 A1, this thickness is preferably limited to 5 µm to ensure good thermoelectric properties. Thin layers, however, suffer from the disadvantage that, because the current flow through thin layers is limited, the thermoelectric generators produced from them cannot deliver much power.

SUMMARY OF THE INVENTION

Proceeding from this prior art, the invention is based on the goal of creating a method for producing thermoelectric layers which are better suited for use in thermoelectric generators, and which in particular comprise higher Seebeck coefficients. Another goal is to simplify the production of the targets.

The goal is achieved in a method of the type described above in that the target of thermoelectric material is produced by mixing at least two starting materials in the foam of powders with a particle size in the range of 0.5-150 µm under the input of energy and by depositing the thermoelectric material from the target onto the substrate by means of magnetron sputter deposition.

Producing the target out of thermoelectric material eliminates the need to produce several targets, each consisting of one of the individual elements bismuth, tellurium, selenium, and antimony. The thermoelectric targets are produced by mixing together at least two powdered starting materials with a particle size in the range of 0.01-5,000.00 µm, and especially of 0.5-150 µm, under the input of energy. Producing the target out of thermoelectric material also makes it possible to make the transition to magnetron sputter deposition.

According to the invention, the thermoelectric materials are deposited from the previously produced target by magnetron sputter deposition. Instead of leading to the high degree of crystallization desired in the past, magnetron sputter deposition leads to a lower degree of crystallization. The surprising discovery was made, however, that the number of grain boundaries between the crystals is increased, as a result of which, in spite of the low degree of crystallization, the Seebeck coefficient in the thermoelectric layers is higher and thus the efficiency of a thermoelectric generator produced from the thermoelectric layers is improved.

The invention exploits the nanostructuring process associated with the high growth rates which occur during magnetron sputtering to improve the thermoelectric properties of the deposited thermoelectric layers. Because of the many defects and grain boundaries and the short distance between these crystal defects, the material properties of the deposited layers are changed in such a way that the Seebeck coefficient is increased to a value greater than that of a single crystal. The nanostructuring also increases the electrical and thermal conductivities, which again has the effect of improving the thermoelectric properties of the deposited materials.

As a result of the magnetron sputtering employed according to the invention, the previous limitation on the thickness of the thermoelectric layers is eliminated, so that much higher currents and thus larger amounts of power can be generated by the layers. These thicker layers can be deposited without sacrificing the thermoelectric properties of the deposited material.

Another advantage of magnetron sputter deposition is that the alloy does not separate into its starting materials. The adhesion and homogeneity of the layer on the substrate is also better than in the case of reactive sputtering.

Magnetron sputter deposition is carried out with a magnetron sputter system, in which magnets for generating a magnetic field are set up behind the cathode plate. By the superimposition of electric and magnetic fields, the charge carriers do not move parallel to the electric field lines but are instead deflected along a cycloidal path. The longer distance which the electrons thus travel leads to a larger number of collisions with the noble gas atoms and thus to a higher degree of ionization of the noble gas, which has the effect of increasing the sputtering rate. More thermoelectric material is deposited from the target onto the substrate at the same process pressure. Because layer growth and thus the properties of the layer depend not only on temperature but especially on the process pressure within the reaction chamber of the magnetron sputter system, it is possible to choose a much lower process pressure than that used in conventional reactive sputtering (up to 100× lower) without affecting the growth rate. This leads to a denser, less porous thermoelectric layer on the substrate, because fewer gas atoms are incorporated into the layer. The resulting layers therefore tend to be less subject to the brittleness caused by the incorporation of foreign atoms into the crystal lattice or into the grain boundaries ("interstitial atoms").

To produce the target, it is preferable to mix together, under the input of energy, at least two different starting materials with a particle size in the range of 0.01-5,000.00 µm, and especially in the range of 0.5-150 µm, selected from the starting materials listed below, so that a layer-like structure of the starting materials is formed, i.e., the particles of the first starting material are at least partially wetted by the second starting material.

The sputter targets produced in this way result in optimal thermoelectric layers when the following compositions and starting materials are used:
  a p-type target with the currently optimal composition of 25 mol. % of $Bi_2Te_3$ (bismuth telluride) and 75 mol. % of $Sb_2Te_3$ (antimony telluride) or $(Bi_{0.25}Sb_{0.75})_2Te_3$, where the composition can be varied in the range of 60-90 mol. % of $Sb_2Te_3$ and correspondingly 10-40 mol. % of $Bi_2Te_3$;
  an n-type target with the optimal composition of 90 mol. % of $Bi_2Te_3$ (bismuth telluride) and 10 mol. % of $Bi_2Se_3$ (bismuth selenide) or $Bi_2(Te_{0.9}Se_{0.1})_3$ with variation of the composition in the range of 5-20 mol. % of $Bi_2Se_3$ and correspondingly 80-95 mol. % of $Bi_2Te_3$;
  Si and Ge with compositions in the range of 65-95 mol. % of silicon and 5-35 mol. % of germanium. It is also necessary to dope silicon and germanium in such a way that two different targets are obtained, one of the n-type and one of the p-type. Doping means that a small concentration (<1%) of a dopant is added, as a result of which only the electronic properties of the silicon-germanium, not the fundamental properties, are affected. To produce a p-type target, the p-type doped starting materials silicon and germanium are mixed together. Doping substances which can be used include B, Al, Ga, and In.

For the production of an n-type target, the n-type doped starting materials silicon and germanium are mixed together. Doping substances which can be used include P, As, and Sb;
  carbides, especially $B_4C$, $B_9C$, $B_9C$, and SiC, which are compound semiconductors with a wide band gap for high-temperature applications;
  clathrates, especially those based on germanium and silicon, including, for example, $Ba_8Ge_{43}$, $(Ba,Sr)_8Ga_{10}Ge_{30}$, $Cs_8Na_{16}Si_{136}$, $Cs_8Na_{16}Ge_{136}$, $Rb_8Na_{16}Si_{136}$, or $Rb_8Na_{16}Ge_{136}$. These materials form a cage structure of silicon or germanium, containing one or more atoms in the interior cavity;
  nitrides, e.g., GaN, AlN, InN, and SiN, which are compound semiconductors with a wide band gap for high-temperature applications. Currently, these materials are used for opto-electronic components such as blue LEDs. In the pure, nonconducting form, these materials are also used as functional ceramics;
  skutterudites, e.g., $CoSb_3$. These materials have a common crystal structure, which can also be considered to be in the form of cages, in which atoms can be enclosed. This has the effect of lowering the thermal conductivity;
  perovskites have a unit cell which can be considered layered. This leads to low thermal conductivities or to superconductivity, depending on the atoms contained in it. Such materials include, for example, $LaCoO_3$, $La_{1-x}Sr_xCoO_3$, $Bi_2Ca_2Co_2O_x$, $NaCo_2O_4$, $Ca_3Co_4O_9$, and $Ca_3Co_2O_6$;
  Zintl phases offer good properties for thermoelectric applications because of their chemical bonds, which lead to a unit cell with a low degree of order and thus a high scattering rate for phonons. Such materials include, for example, $Zn_4Sb_3$, $Ca_{11}GaSb_9$, $CaZn_2Sb_2$, and $BaGa_2Sb_2$;
  half-Heusler compounds such as AgAsMg and AlLiSi. The combination of light and heavy atoms within the unit cell impedes the smooth transport of phonons and thus leads to low thermal conductivities;
  carbon-based semiconductors such as CNT and graphene. These materials form thin layers in which the quantum-mechanical properties of the electrons lead to properties considerably different from those of carbon. These properties increase the electrical conductivity and/or the Seebeck coefficient and therefore offer good starting position for thermoelectric components; and
  metal oxides, especially titanium oxide, with varying amounts of oxygen to determine, the doping and the type of semiconductor.

An especially advantageous method for producing the target of thermoelectric material comprises the following steps:

grinding the at least two powdered starting materials;

removing the starting materials which have become alloyed by the grinding process; and then sintering the alloyed starting materials at temperatures in the range of 200-1,000° C., depending on the material.

The grinding of the at least two powdered starting materials is carried out in particular with the help of a grinding-body mill, preferably a ball mill or jet mill. The grinding bodies and the powdered starting materials, i.e., the material to be ground, are agitated in the grinding-body mill. The material to be ground is broken down into smaller particles as it comes between the grinding bodies and is subjected to the resulting impact and shock. The powdered starting materials are thus mixed intensively together. The input of energy is achieved through the loads delivered by the impacts and shocks. Grinding the powdered starting materials in this way is called "mechanical alloying". As a result of the local increase in temperature during grinding, at least one of the starting materials can be present in partially molten form and thus form the layer-like structure by wetting the particles of the other starting material.

After grinding is complete, the powdered starting materials are sintered. Sintering comprises the pressing of the ground starting materials into a structure, the so-called "green body". By sintering this structure at temperatures in the range of 200-1,000° C., approximately 60-80% of the melting temperature, the structure is hardened into the target.

In an advantageous embodiment of the invention, mechanical alloying can be accelerated by supplying heat during the grinding of the at least two powdered starting materials.

Alternatively, the target of thermoelectric material can be produced by so-called plasma alloying from the at least two powdered starting materials. For this purpose, the powdered starting materials are first introduced into a stream of gas, especially air, argon, nitrogen, hydrogen, or oxygen or mixtures of these gases, and mixed together there. The gas stream carrying the starting materials is fed into the gas jet of a cold atmospheric plasma. The two starting materials are alloyed together at a temperature of the cold atmospheric plasma of below 1,000° C., wherein the previously described layer-like structure of the starting materials is built up, i.e., the one starting material becomes wetted with the other starting material. An advantageous mass flow rate of the starting materials in the infed gas stream is in the range of 0.01-200 g/sec-cm$^2$.

In another embodiment of the inventive method, a further improvement in the Seebeck coefficient of the deposited thermoelectric layer can be achieved by tempering the layer at a temperature in the range of 200-1,000° C., depending on the starting materials used.

"Tempering" means that the layer is heated to a temperature below its melting temperature over a relatively long period of time, usually between 30 minutes and a few hours, wherein structural defects are healed and the structure of the crystals is improved.

It is assumed that, before recrystallization (or the growth of the crystals), the layers have a nanostructure in which the crystallites are only a few nm in size and therefore in which the grain boundaries (the unstructured environment of the crystallites) also form a superstructure with a period length of a few nm. On this size scale, the quantum-mechanical nature of charge transport becomes quite pronounced, and, in addition to the charge transport in the conduction and valence bands within the crystallites, there is also a conductivity mechanism based on "hopping", according to which localized quantum-mechanical states merge with each other because of the short distances between them and thus form a continuous "quasiband". This quasiband has metallic properties in contrast to the semiconducting (insulating) properties within the crystallites, as a result of which two different phases, a metallic phase and a semiconducting phase, are formed. During tempering, the crystallites increase in size (recrystallize), and the distance between the grain boundaries increases. Thus the efficiency of the hopping mechanism decreases, and the semiconducting properties of the materials become dominant. The hopping mechanism changes the density of states of the electrons and holes in such a way that that the Seebeck coefficient becomes larger.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the following, the inventive method is explained in greater detail on the basis of FIGS. 1-3.

DETAILED DESCRIPTION OF THE PREFERRED EMBODIMENTS

Figure 1:
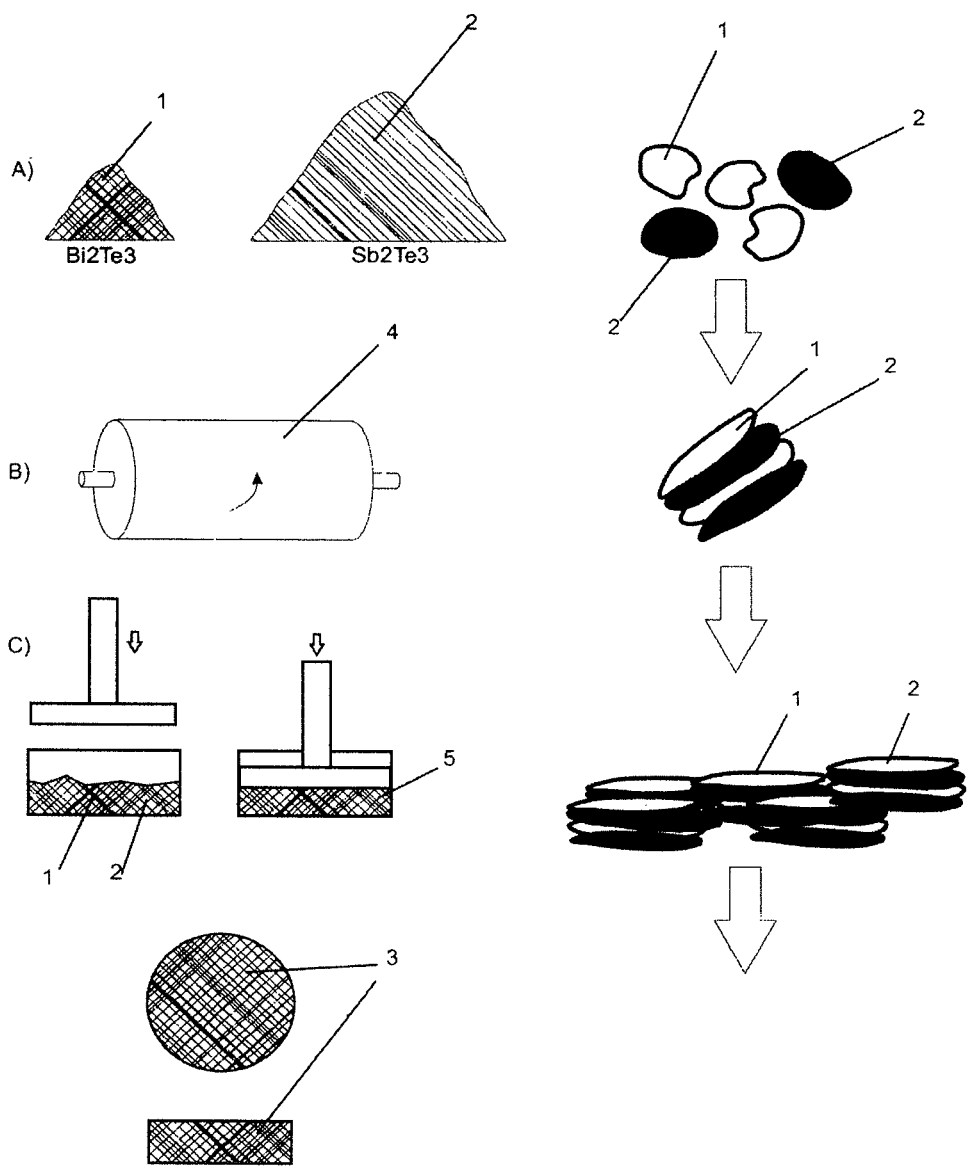
FIGS. 1(A)-1(C) show the production of a target of thermoelectric material by mechanical alloying.

FIG. 1(A) shows bismuth telluride ($Bi_2Te_3$) as the first starting material 1 and antimony telluride ($Sb_2Te_3$) as the second starting material. For the production of a target 3 of thermoelectric material, the two starting materials 1, 2 with a composition of 25 mol. % of bismuth telluride ($Bi_2Te_3$) and 75 mol. % of antimony telluride ($Sb_2Te_3$) are loaded into a ball mill 4 (FIG. 1(B)), where the two starting materials 1, 2 are ground in the ball bill. As a result of mechanical alloying, the layer-like structure of the starting materials 1, 2 visible in the right half of FIG. 1(B) is obtained in the form of agglomerates, which are formed in the ball mill 4 during the process of mechanical alloying.

Then the starting materials 1, 2 which have been alloyed as shown in FIG. 1(C) by the grinding process are sent to a sintering process. For this purpose, the alloyed starting materials 1, 2 are compacted into a structure 5 and hardened below the melting temperature of the alloyed starting materials 1, 2.

In the left half of FIG. 1(C), finally, we see the starting materials compacted and hardened into the target 3.

FIGS. 2(A) and 2(B) show the production of the target 3 of the first starting material 1 and the second starting material 2 by plasma alloying.

To produce the cold atmospheric plasma in a gas jet 6 required for this purpose, a hollow cylindrical plasma generator 7 is used, to one end of which a feed line 8 for a working gas is connected. A pin electrode 9 extends into the plasma generator 7 from the center of this feed end. At the opposite end of the plasma generator 7, which tapers down in the manner of a nozzle, there is a ring electrode 10. An ignition voltage is applied between the pin electrode 9 and the ring electrode 10; this voltage leads to a strikeover and to the ignition of a gas discharge between the electrodes 9, 10. The cold atmospheric plasma is generated in the gas jet 6 formed in the working gas flowing through the plasma generator 7 in the direction of the arrows 11.

Transversely to the flow direction 11 of the working gas, an inlet 13 for supplying another gas stream 14 to the plasma generator 7 is also incorporated into the plasma generator 7, near its nozzle-like tapering tip 12. The gas stream 14 contains the two powdered starting materials 1, 2, which have already been introduced into it, and they are mixed together as they are transported in the gas stream. The first and second powdered starting materials 1, 2 are introduced with the gas stream 14 into the gas jet 6. As a result of the input of energy E which occurs in the gas jet 6 of the plasma generator, the layer-like structure of the starting materials 1, 2 is produced, as can be seen in the right half of FIG. 2(A); the target 3 shown in FIG. 2(B) is thus obtained. The starting materials are deposited in particular on a substrate of copper, which is wired to serve as the target cathode in the magnetron sputter system 17.

Figure 2:
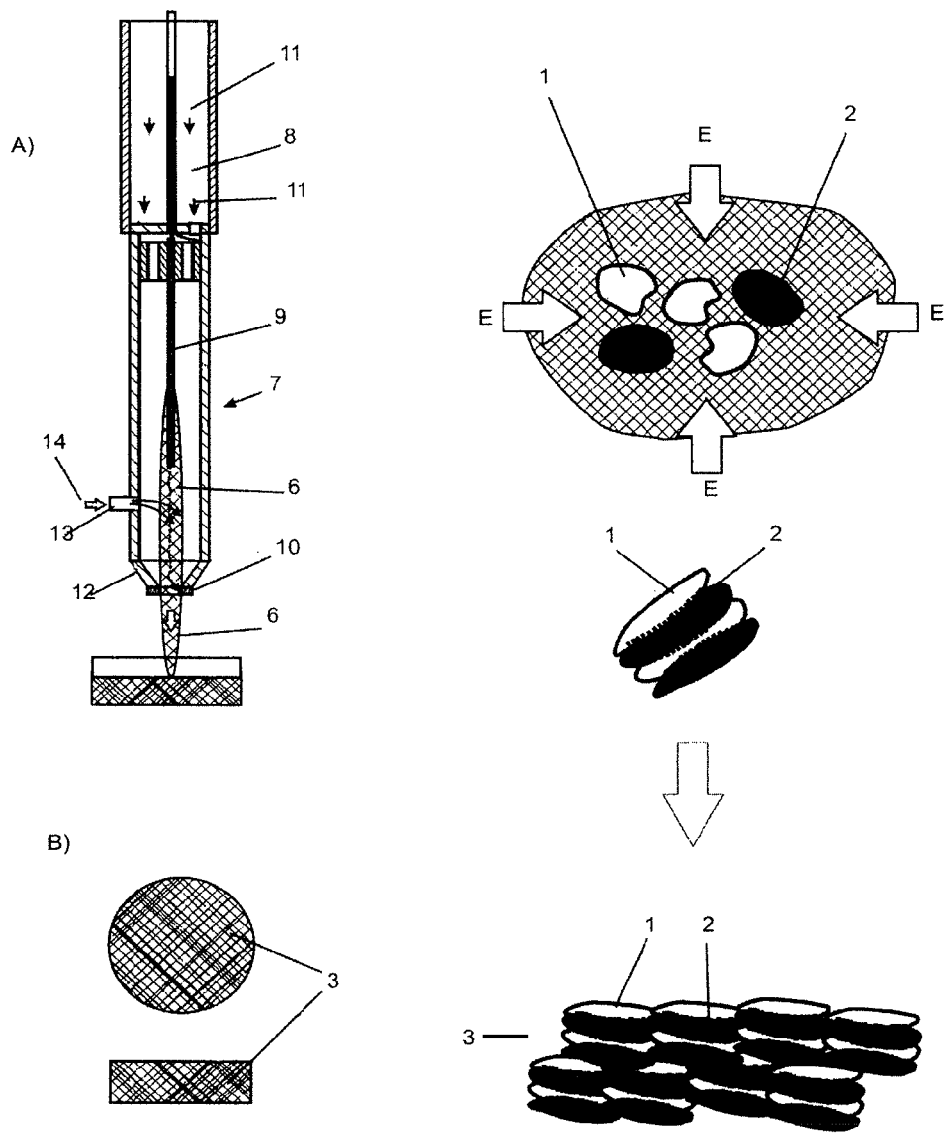
FIGS. 2(A)-2(B) show the production of a target of thermoelectric material by plasma alloying.
Figure 3:
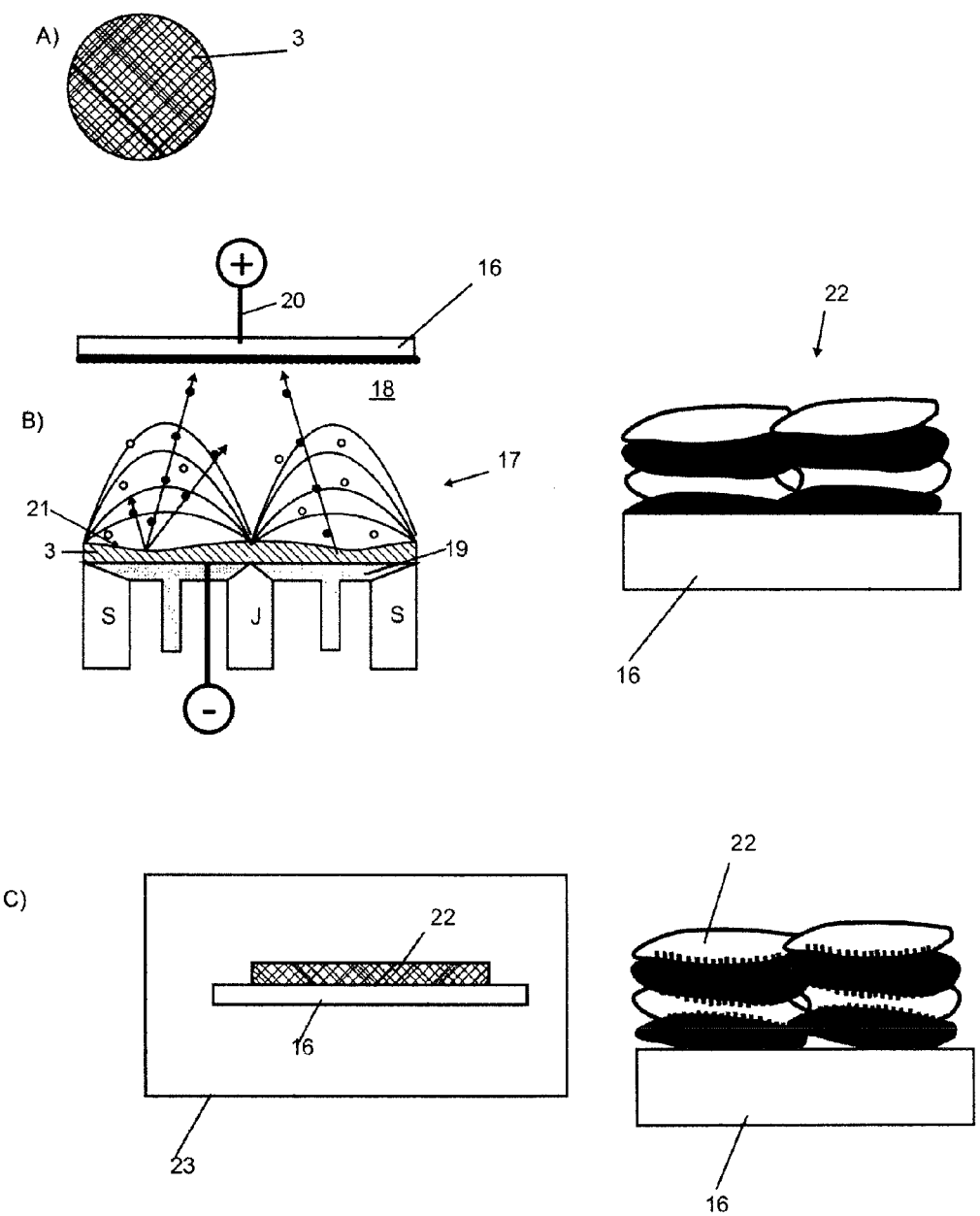
FIGS. 3(A)-3(C) show the introduction of the target into the magnetron sputtering, the deposition of the thermoelectric material by magnetron sputter deposition, and the following tempering of the thermoelectric layer deposited on the substrate.

FIG. 3(A) shows the target 3, which was produced either by mechanical alloying according to FIG. 1 or by plasma alloying according to FIG. 2.

The thermoelectric material from the target 3 is deposited onto a substrate 16 by magnetron sputter deposition. The magnetron sputter deposition system 17 required for this comprises an evacuated work chamber 18, in which a noble gas, especially argon, is used. The target cathode 19, which is preferably designed in the form of a plate, is positioned on one side of the work chamber. The substrate 16 is mounted near the target 3, which itself rests on the target cathode 19, so that the atoms which have been dislodged by bombardment with high-energy noble-gas ions and converted into the gas phase can then condense on the substrate 16, where they are thus able to form the layer 22 of thermoelectric material.

A DC gas discharge between the target cathode 19 and the anode 20 serves as the ion source. Behind the target cathode 19 are magnets to create an additional magnetic field. The magnetic field is superimposed on the electric field produced by the target electrode 19 and the anode 20. This has the effect of generating a greater degree of ionization in the area parallel to the surface 21 of the target 3.

Finally, in the last step as shown in FIG. 3(C), the thermoelectric layer 22 deposited on the substrate 16 is tempered in a tempering furnace 23 at a temperature of 200-1,000° C., depending on the thermoelectric material of the target 3. The temperature during tempering is to be determined so that the thermoelectric layer 22 is always at a temperature below the melting point of the layer. If bismuth telluride is one of the starting materials, tempering is carried out at 200-400° C. If skutterudites and clathrates are the starting materials of the thermoelectric material, tempering is carried out in a temperature range of 500-700° C. If silicon and germanium or perovskites are the starting materials of the thermoelectric material, tempering is carried out in a temperature range of 800-1,000° C.

By optimizing the temperature profile during tempering, the recrystallization can be controlled in such a way that the Seebeck coefficient of the deposited thermoelectric layer 22 is greater than the Seebeck coefficient of the pure crystalline thermoelectric materials.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for producing thermoelectric layers configured for thermoelectric generators by depositing thermoelectric material onto a substrate by sputter deposition, comprising the steps of producing a target of thermoelectric material by mixing together at least two powdered starting materials in a particle size of 0.01-5000.00 μm under the input of energy by one of mechanical alloying and plasma alloying, wherein the mechanical alloying includes grinding the powdered starting materials, and the input of energy is achieved through loads delivered by impacts and shocks during the grinding, and depositing the thermoelectric material from the target onto the substrate by magnetron sputter deposition, thereby forming the thermoelectric layers configured for thermoelectric generators, where a magnetic field is superimposed on an electric field produced by a target cathode and an anode and only a DC gas discharge between the target cathode and the anode serves as an ion source for the magnetron sputter deposition.

2. The method according to claim 1, the at least two powdered starting materials include at least two different materials from one of the following groups of starting materials mixed together:

$Bi_2Te_3$, $Bi_2Se_3$, $Sb_2Te_3$;
PbTe;
Si, Ge;
carbides;
perovskites;
clathrates;
skutterudites;
nitrides;
Zintl phases;
half-Heusler compounds;
carbon-based semiconductors; and
metal oxides.

3. The method according to claim 2, wherein the step of producing includes producing a p-type target using the starting materials $Sb_2Te_3$ and $Bi_2Te_3$ mixed together, and the p-type target comprises 60-90 mol. % of $Sb_2Te_3$.

4. The method according to claim 2, wherein the step of producing includes producing an n-type target using the starting materials $Bi_2Se_3$ and $Bi_2Te_3$ mixed together, and the n-type target comprises 80-95 mol. % of $Bi_2Se_3$.

5. The method according to claim 2, wherein the step of producing includes producing an n-type target by mixing together the n-type doped starting materials silicon and germanium.

6. The method according to claim 2, wherein the step of producing includes producing a p-type target by mixing together the doped starting materials silicon and germanium.

7. The method according to one of claims 1, wherein the step of producing comprises
grinding the at least two powdered starting materials;
removing the starting materials, which have been alloyed by the grinding process; and then
sintering the alloyed starting materials at temperatures in the range of 200-1,000° C.

8. The method according to claim 7, wherein the at least two powdered starting materials are ground in a grinding-body mill.

9. The method according to claim 1, wherein the step of producing comprises introducing the at least two powdered starting materials into a gas stream;
generating a cold atmospheric plasma in a gas jet; and
feeding the gas stream into the gas jet.

10. The method according to claim 9, wherein the cold atmospheric plasma comprises a temperature below 1,000° C.

11. The method according to claim 9, wherein the mass flow rate of the starting materials in the gas stream is in the range of 0.01-200 g/sec-cm$^2$.

12. The method according to one of claim 1, further comprising tempering the layer deposited onto the substrate.

13. The method according to claim 12, wherein the tempering of the layer is performed at a temperature in the range of 200-1,000° C.

* * * * *